United States Patent [19]

Schutyser et al.

[11] Patent Number: 5,110,867
[45] Date of Patent: May 5, 1992

[54] INTERPENETRATING POLYMER NETWORK OF EPOXY RESIN, POLYALLYL POLYMER AND ANHYDRIDE

[75] Inventors: Jan A. J. Schutyser, Dieren; Antonius J. W. Buser, Wehl; Pieter H. Zuuring, Nijmegen; Hendrik J. Slots, Rijssen, all of Netherlands

[73] Assignee: Akzo NV, Arnhem, Netherlands

[21] Appl. No.: 581,483

[22] Filed: Sep. 12, 1990

[30] Foreign Application Priority Data

Sep. 15, 1989 [NL] Netherlands ............ 8902310

[51] Int. Cl.$^5$ .............. C08L 39/04; C08L 63/02; C08L 63/04
[52] U.S. Cl. .................... 525/114; 525/903
[58] Field of Search .............. 525/114, 529, 903

[56] References Cited

U.S. PATENT DOCUMENTS

| | | | |
|---|---|---|---|
| 2,707,177 | 4/1955 | Skiff et al. | 525/114 |
| 3,291,857 | 12/1966 | Howerton | 525/114 |
| 4,468,485 | 8/1984 | Gourdenne et al. | 523/137 |
| 4,957,981 | 9/1990 | Schutyser et al. | 525/529 |

FOREIGN PATENT DOCUMENTS 58-57423  4/1983  Japan .................. 525/114

*Primary Examiner*—John C. Bleutge
*Assistant Examiner*—Robert E. L. Sellers, II
*Attorney, Agent, or Firm*—Louis A. Morris

[57] ABSTRACT

Polymeric materials comprising an interpenetrating network (IPN) prepared from allyl polymers and epoxy resins. The allyl polymers are crosslinked under the influence of a radical initiator, the epoxy resin is crosslinked by a curing agent. The curing agent is a cyclic anhydride containing a polymerizable double bond. The two networks are interlinked as a result of the double bond being involved in the curing reaction of the allyl polymers. The cyclic anhydride preferably is maleic anhydride. Preferred IPN's are prepared form triallylcyanurate or triallylisocyanurate-based allyl polymers and phenol-type epoxy resin.

7 Claims, No Drawings

INTERPENETRATING POLYMER NETWORK OF EPOXY RESIN, POLYALLYL POLYMER AND ANHYDRIDE

BACKGROUND OF THE INVENTION

1. Field of the Invention

The invention relates to a polymeric material comprising an interpenetrating network built up from a polymer that can be cross-linked under the influence of radicals and an epoxy resin comprising a cross-linking agent. The invention has for its object the manufacture of new materials especially suited to be used in the electronics industry (electronic materials for short).

2. Description of the Prior Art

A polymeric material of the type mentioned above is known from U.S. Pat. No. 4,468,485. In this patent specification the polymer that can be cross-linked under the influence of radicals is an unsaturated polyester resin. The epoxy resin is of the DGEBA type (diglycidyl ether of Bisphenol-A) and is cross-linked using a polyfunctional amine. For the preparation of an interpenetrating network (IPN) without phase separation the above-mentioned patent specification describes a process in which use is made of microwave radiation of a frequency spectrum so chosen as to effect the cross-linking of the polyester, with the heat released in this process triggering the cross-linking reaction of the epoxy resin. Admittedly, in this manner there is obtained a polymeric material which has one single glass transition temperature (Tg) (in the range of 50°-100° C. depending on the IPN's composition), but the process used is not universally applicable.

Said patent specification thus does not teach the skilled man how, by the proper selection of IPN components, suitable electronic materials can be manufactured.

It is generally known that there is a need to replace the present electronic materials with materials meeting requirements such as
low dielectric constant
low electrical dissipation factor
high Tg
ready processability
low price
high dimensional stability
high solvent resistance
more satisfactorily.

The invention employs IPN technology to obtain materials especially suited to be used in the electronics industry.

SUMMARY OF THE INVENTION

A polymeric material comprising an interpenetrating network (IPN) built up from a polymer that can be cross-linked under the influence of radicals and an epoxy resin comprising a cross-linking agent. The polymer that can be cross-linked under the influence of radicals is built up from at least one polyallyl compound together or not with an aromatic difunctional methacrylate. The cross-linking agent for the epoxy resin is a cyclic carboxylic anhydride which also contains a functional group polymerizable under the influence of radicals.

DETAILED DESCRIPTION OF THE INVENTION

In the present invention a polymeric material of the above-mentioned known type which can be cross-linked under the influence of radicals is built up from polyfunctional allyl monomers or prepolymers together or not with an aromatic difunctional methacrylate, and the cross-linking agent for the epoxy resin is a cyclic carboxylic anhydride also containing a functional group polymerizable under the influence of radicals. (To be referred to hereinafter as copolymerizable cyclic anhydride.)

Such a cross-linking agent serves to chemically link the networks of an IPN consisting of two networks cross-linked in chemically different ways. It has been found that such chemically linked IPNs display very favorable properties. In particular, chemically linking is found to lead to very favorable thermal properties, which is shown by, int. al., a single high glass transition temperature (Tg). Moreover, it is possible using the chemically linked IPNs according to the invention to obtain fire retardant resins having a bromine content of about 10% or even less. This is below the level required for known electronic materials (usually about 20% bromine), which is beneficial to the environment. Known electronic materials include the epoxy resins described in WO 85/03515 and WO 86/02085.

Examples of cyclic carboxylic anhydrides containing a functional group polymerizable under the influence of radicals include maleic anhydride, itaconic anhydride, and citraconic anhydride. These are the most readily available copolymerizable cyclic anhydrides, but the invention is not limited to them. As a copolymerizable anhydride that is easy to prepare may be mentioned the allyl ester of trimellitic anhydride.

Alternatively, it is possible to copolymerize the copolymerizable cyclic anhydride with allyl monomers prior to IPN preparation. The cross-linking agent for the epoxy resin in that case will be a side group of a polymer formed under the influence of radicals. An advantage to this process is that possible volatization of the free anhydride during IPN preparation is prevented.

As is self-evident from the above, the essence of the present invention resides in that in an IPN comprising a polyallyl network and an epoxy resin network these networks are interlinked. This interlinking determines to a high degree the IPN's properties. Accordingly, the networks can be built up from many types of monomers or prepolymers.

Of course, the two IPN-forming polymers are mixed in such a ratio as to give a resin of which the properties are no longer determined by one of the IPN constituents individually. Although this ratio is to some extent dependent on the type of allyl compound and the type of epoxy resin used, in general a weight ratio of 80/20 or 20/80 will be adhered to as a limit. Since both the allyl polymer and the epoxy resin provide a share of the favorable IPN properties, the preferred ratio is dependent on those properties which are especially envisaged. If it is desired to stress electrical or thermal properties, then a ratio of allyl polymer to epoxy resin of 70/30–60/40 will be selected; if the manufacture is desired of a laminate with a metal layer (such as for printed circuits), then a ratio of allyl polymer to epoxy resin of 30/70–40/60 will be chosen on account of the favorable peel strength. Preference is given to an IPN in which the properties of the two constituents come out optimally. This is the case for a ratio of allyl polymer to epoxy resin of 40/60–60/40, more preferably 50/50.

As suitable allyl monomers may be mentioned triallyl cyanurate (TAC), triallyl isocyanurate (TAIC), aromatic polyallyl esters, such as diallyl phthalate, diallyl isophthalate, triallyl trimellitate, tetrallyl pyromellitate, diallyl tetrabromophthalate; aliphatic polyallyl esters, such as diallyl adipate, diallyl maleate, diallyl fumarate, and polyallyl carbonates such as diethylene glycol diallyl carbonate.

Also, mixtures of allyl monomers and allyl prepolymers may be employed for the preparation of an IPN according to the invention.

Preference is given to ring-containing polyallyl compounds, with TAC and TAIC providing optimum results as regards thermal properties. Moreover, TAC has the advantage that it may also serve as a solvent in the IPN preparation; consequently, additional solvent may largely be omitted.

The structural formulae of TAC and TAIC are given below:

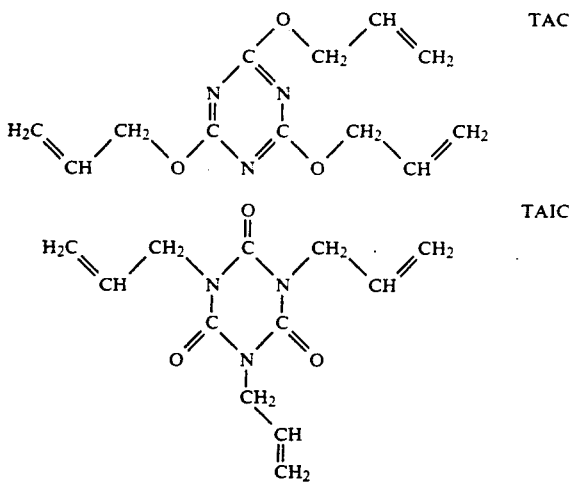

TAC and TAIC prepolymers can be prepared by the partial polymerization of TAC monomer or TAIC monomer in, say, methylethyl ketone (MEK) in the presence of a peroxide of a relatively low decomposition temperature, e.g. dibenzoyl peroxide or di(orthomethylbenzoyl)peroxide. The monomer conversion, the viscosity, and the molecular weight distribution of the TAC or TAIC oligomers can be controlled by means of the amount of peroxide employed and the reaction time. Optionally, use may be made in the polymerization process of a chain regulator such as carbon tetrabromide to prevent the prepolymerization resulting in gelling.

As is known to the skilled man, it is possible to remove monomers from TAC or TAIC prepolymers by selective precipitation, using a suitable organic solvent.

Aromatic difunctional methacrylates may be used to partially replace the polyallyl compounds in the IPN. Suitable methacrylates may be of the following structural formula:

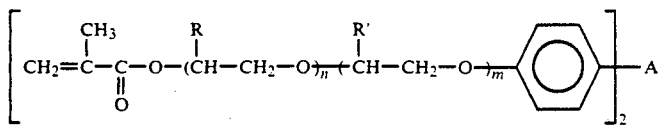

wherein R and R' may be the same or different and represent H or $CH_3$, n and m may be the same or different and 0, 1, 2, 3 or 4, with n+m being 4 maximum, and wherein A represents a hydrocarbon group having 1-6 carbon atoms, or else stands for

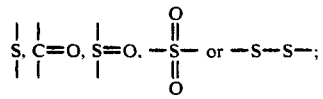

Preferably, use is made of 2,2-di(4-methacryloxyethoxyphenyl)propane (BMEPP).

The polymerization of ring-containing polyallyl compounds is carried out under the influence of an initiator that will generally be employed in a ratio of 0.1-5 wt. %, calculated on the allyl compound. Examples of suitable initiators include peroxides, such as t-butylperoxy benzoate, t-butylperoxy -3,5,5-trimethyl hexanoate, and benzoyl peroxide.

By the term "epoxy resin" is meant a curable composition of oxirane ring-containing compounds. Such compounds have been described in C.A. May's "Epoxy Resins", 2nd. Edition, Marcel Dekker Inc., New York & Basle, 1988.

As examples of epoxy resins may be mentioned phenol types, such as those based on the diglycidyl ether of Bisphenol-A, on polyglycidyl ethers of phenol-formaldehyde Novolac or cresol-formaldehyde Novolac, on the triglycidyl ether of tris(p-hydroxyphenol)methane, or on the tetraglycidyl ether of tetraphenyl ethane; amine types, such as those based on tetraglycidyl methylene dianiline or on the triglycidyl ether of p-aminoglycol; cycloaliphatic types, such as those based on 3,4-epoxycyclohexylmethyl-3,4-epoxycyclohexane carboxylate.

By the term "epoxy resin" are also meant reaction products of compounds (e.g. of the foregoing types) containing an excess of epoxy with aromatic dihydro compounds. These dihydro compounds may be halogen substituted. The same epoxy resins were described in WO 86/02085 referred to above.

Preference is given to epoxy resins of the phenol type, especially because of their low price.

It should be noted that, as a rule, one unequivocal structural formula is used to illustrate epoxy resins. Differing products resulting from side reactions which occur in the preparation of epoxy resins should, as the skilled man knows, be considered to be included therein. As these side products form a standard constituent of cured epoxy resins, so they make up a standard constituent of the IPNs according to the invention.

Cross-linking of the epoxy resin generally is carried out using an accelerator. As suitable accelerators may be mentioned imidazoles, more particularly alkyl substituted imidazoles such as 2-methyl imidazole and 2-ethyl-4-methyl imidazole, and tertiary amines such as benzyl dimethyl amine.

The amount employed of such an accelerator is dependent on the type of epoxy resin, the type of cross-linking agent, and the type of accelerator, but, generally, it will be in the range of 0.01-5 wt. %, calculated on the overall weight of epoxy resin and cross-linking agent.

In general, an organic solvent will be employed when preparing IPN resins according to the invention. It has already been noted that, when TAC is used as an IPN constituent, it can also serve as a solvent. If an additional solvent is employed, then the epoxy resin, cross-linking agent, and polyallyl compound must be soluble therein, and the solvent must be sufficiently volatile to evaporate before or during partial curing of the IPN, or else before it is definitively cured.

Suitable solvents include dimethyl formamide; glycol ethers such as ethylene glycol monoethylether or propylene glycol monoethylether and esters thereof such as ethylene glycol monoethylether acetate; ketones, such as methyl isobutyl ketone, methylethyl ketone, acetone, and methyl isopropyl ketone; aromatic hydrocarbons such as toluene and xylene. Also, use may be made of mixtures of solvents. The preferred solvents are ketones, notably acetone and methylethyl ketone or mixtures thereof with ethers, notably propylene glycol monoethylether.

It appears from the above that halogen substituents can be introduced into various IPN constituents. This is to make the IPN sufficiently fire retardant. Preferably, bromine is used for this purpose.

Further, the invention relates to laminates for the electronics industry into which IPNs of the above-described type have been incorporated.

Laminates for the electronics industry (notably for printed circuit boards) generally are manufactured by impregnating a supporting or reinforcing web with a resin, after which the resin is partially cured. Such an impregnated web is usually indicated with the term prepreg. The manufacture of a printed circuit board comprises laminating one or more layers of the prepreg with, say, one or more layers of copper.

For the resin use is generally made of epoxy resins The present standard in actual practice is the FR4 laminate based on a brominated epoxy resin prepared from a diglycidyl ether of Bisphenol-A and tetrabromo Bisphenol-A, dicyanodiamide as a curing agent, an organic solvent, an accelerator, and a catalyst. The drawback to such an epoxy resin is its low Tg (110°-135° C.), and furthermore the dicyanodiamide has a tendency to crystallize in the resin and the prepreg manufactured therefrom Although WO 85/03515 referred to above describes an epoxy resin which is superior to FR4 in several aspects, said resin possesses a number of already discussed drawbacks as compared with the IPN resins according to the invention.

The IPN resins according to the invention are highly suited to be used in impregnating, say, fabric and cloth of varying materials, such as glass, quartz, carbon, aramid, and boron fibers, more particularly for the preparation of laminates for printed circuit boards. For this application the IPN is preferably used in combination with a glass fibre mat.

Also, the IPN resins according to the invention may be employed where use is made of conventional epoxy resins: as adhesive, coating, molding resin, embedding resin, encapsulating resin, sheet molding compound, and bulk molding compound.

In addition to the aforementioned application as a composite for printed circuit boards the IPN resins according to the invention may be used for the manufacture of composites for, e.g., the construction, aviation, and automobile industries. A structural component suitable for this purpose can be manufactured in a known manner, for instance by impregnating reinforcing material with molten or dissolved resin or by resin transfer molding, filament winding, pultrusion, or RIM (Reaction Injection Molding).

The IPN resins according to the invention may contain conventional additives such as dyes or pigments, thixotropic substances, fluidity control regulators, and stabilizers.

The invention will be further illustrated with reference to the following unlimitative examples.

Further explanation:

Epoxy resin A is a polyglycidyl ether of phenol-formaldehyde Novolac resin having an epoxy equivalent weight (EEW) of 178 and an average epoxy functionality of 3.5.

Epoxy resin B is a polyglycidyl ether of phenol-formaldehyde Novolac resin having an average epoxy functionality of 2,5 and an EEW of 175.

Epoxy resin C is N,N,N',N'-tetraglycidyl-bis(4-aminophenyl)methane having an EEW of 126.

Epoxy resin D is a diglycidyl ether of Bisphenol-A having an EEW of 174.

Epoxy resin E is the reaction product of tetrabromo Bisphenol-A and an excess of diglycidyl ether of tetrabromo Bisphenol-A, having an EEW of 450 and a percentage by weight of bromine of 50.

Epoxy resin F is the reaction product of tetrabromo Bisphenol-A and an excess of diglycidyl ether of Bisphenol-A. The EEW and percentage by weight of bromine are 415 and 19, respectively.

Determination of properties

The coefficient of thermal expansion (TEC) in the z-direction and also Tg were determined using a Dupont Thermal Mechanical Analyzer (TMA), basic module 990 with TMA module 942 at 100 ml/min in an atmosphere of nitrogen. Values were determined both during heating (5° C./min) and cooling (2° C./min).

The decomposition behavior of neat resins was studied with a Dupont Thermo-Gravimetric Analyzer (TGA), basic module 990 with TGA module 951 at a heating rate of 10° C./min in an atmosphere of nitrogen. The study of laminates was conducted in air.

Cured resins were tested for fire retardancy by means of a manual test in which the sample to be tested was held in a flame for 30 seconds. The sample was considered to be fire retardant if it stopped burning immediately upon being removed from the flame. Laminates were tested for fire retardancy in accordance with the UL-94 test, which is known to the skilled man.

EXAMPLE 0

Preparation of TAC prepolymer (used in Examples 11 and 13)

To 1 kg of molten TAC monomer in a reactor (fitted with a cooling apparatus and a stirrer) were added 223 g of MEK. Next, the contents of the reactor were heated to 82° C., with stirring, and over a period of 1 hour there was added dropwise a solution of 4.4 g of di(orthomethylbenzoyl)peroxide in 100 g of MEK phlegmatized with 1.2 g of water.

After a total reaction period of 8 hours at 82° C. the 75%-solution of TAC prepolymer in MEK was cooled down to room temperature. Next, MEK was stripped off under reduced pressure. The result was a TAC prepolymer containing less than 2% of MEK residue with a (Brookfield) viscosity of 1250 mPa.s at 23° C., a monomer conversion (mc) of 37%, a number average molecular weight (Mn) of 8000, and a degree of dispersion (D) of 13 (by HPLC relative to Styrene standards)

EXAMPLE 1

To 37 g of a 73 wt. % solution of epoxy resin A (27 g of resin, 0.152 equivalents) in methylethyl ketone (MEK) were added successively, with stirring: 6.45 g (0.014 equivalents) of solid epoxy resin E, 16.3 g (0.166 equivalents) of maleic anhydride (MZA), and 51 g of the 98 wt. % solution of TAC prepolymer (prepared with benzoyl peroxide, mc 36%, Mn =5900, D=4.7, visc. 1380 mPa.s) in MEK. The part by weight of TAC prepolymer thus was equal to that of solid epoxy resin A plus MZA. The percentage of bromine in the total solid was 3.23%. To the homogeneous solution were then added, with stirring, 1.0 g of a 10 wt. % solution of 2-ethyl-4-methyl imidazole (2E4MI) in MEK and 0.5 g of tert. butyl-peroxy benzoate. The solution, which contained 12 wt. % of MEK, was then poured into aluminum dishes in such a way as to give a layer thickness for the resin solution of about 1 mm. Next, the samples were heated to 60° C. in a forced-circulation air oven and kept at this temperature for 1 hour. The temperature of the oven was then raised to and kept for 30' at 100° C., followed by 3 hours at 150° C. and, finally, 30' at 180° C. After the yellowish-orange homogeneously transparent plates had been cooled slowly and released from the mould, they were post-cured for a further 2 hours at 200° C. and then cooled to room temperature. The following properties were measured on the about 1 mm thick plates:

| Tg (°C.) by TMA | 205 |
|---|---|
| TEC$_z$ (ppm/°C.) | |
| < Tg | 44 |
| > Tg | 135 |
| average (over 20°-250° C.) | 60 |
| TGA (in N$_2$ atmosphere) | |
| loss at 300° C. (%) | 2.0 |
| decomposition maxima (°C.) | 347, 386, 396 |
| residue at 650° C. (%) | 18 |
| Manual flame test, fire retardant? | yes |

EXAMPLE 2

The prepreg and laminates were prepared on the basis of a resin solution consisting of:
706 g of a 85%-solution of epoxy resin A in acetone;
120 g of solid epoxy resin E;
280 g of maleic anhydride;
1176 g of a 85%-solution of TAC prepolymer in MEK (prepared with the use of benzoyl peroxide, m.c % 39, an Mn of 8225, a polymerization degree of 16 and a 85% solution viscosity of 390 mPa.s);
10 g of a 10%-solution of 2-ethyl-4-methyl imidazole in MEK;
10 g of t-butylperoxy benzoate.

The resin solution in which the TAC prepolymer part by weight was equal to that of epoxy resins A and E plus maleic anhydride had a viscosity of 430 mPa.s determined in accordance with the instructions by Brookfield at 23° C.

The E-glass fabric type 7628 (finishing agent Z6040) much used in the electronics industry was manually impregnated with the resin solution. Next, the impregnated fabrics were kept at a temperature of 175° C. in a forced-circulation air oven for 8 minutes, resulting in tack-free prepregs of excellent appearance being obtained in the B stage. The percentage by volume of resin in the prepreg was 46%.

Eight prepregs stacked one on top of the other were molded in an autoclave at a pressure of 25 atm. and a temperature of, successively, 150° C. for 30 minutes, 180° C. for 30 minutes, and, finally, 200° C. for 30 minutes. Heating and cooling was at a rate of 8° C./min. In this manner both a laminate coated on two sides with copper (1 ounce, electrodeposited type) and an uncoated laminate of an overall thickness of 1.60 mm were made.

The properties of the laminate and a reference laminate are given in Table 1. The reference laminate is a purchased standard FR4 laminate that is used on a very wide scale in the printed board industry and contains, in addition to E-glass fabric, a resin made up of brominated Bisphenol A bisepoxy, with dicyanodiamide as curing agent.

Besides the aforementioned techniques the following methods/processes were employed to determine a number of additional properties.

Tg was determined with a type MK1 dynamic, mechanical, thermal analysis (DMTA) apparatus of Polymer Laboratories at 10 Hz under an atmosphere of nitrogen and at a heating rate of 5° C./min.

The dielectric constant and the dissipation factor were measured at 1 MHz on samples which, after having been dried for 30' at 50° C. and cooled in a dessicator, were stored for at least 40 hours at 23° C. in an atmosphere of 50% relative humidity.

The copper peel strength was measured at 23° C. at an angle of 90° C. on a laminate sample of 14×2 on which there was a strip of copper of 3 mm wide. The measuring process was effected by removing excess copper from a copper laminate in a known manner by etching.

TABLE 1

| | Example 2 | Ref (FR-4) |
|---|---|---|
| Tg (°C.) | | |
| DMTA (damping maximum) | 172 [203]$^a$ | 125 |
| TMA | 167 [180]$^a$ | 115 |
| TEC$_z$ (ppm/°C.) | | |
| < Tg | 34 [34]$^a$ | 36 |
| > Tg | 151 [159]$^a$ | 236 |
| average (over 20°-250° C.) | 76 [74]$^a$ | 154 |
| TGA (in air) | | |
| loss at 300° C. (%) | 1.6 | 1.2 |
| decomposition maximum (°C.) | 342; 385 | 320 |
| residual glass (= wt. % glass) (%) | 58 | 65 |
| Dielectric constant ($\epsilon_r$) at 1 MHz | 4.2 | 4.9 |
| Dissipation factor (tan δ) at 1 MHz | 0.01 | 0.03 |
| Copper peel strength (N/cm) | 15 | 15 |

$^a$values in brackets were measured on samples subjected to an additional post-curing treatment in an oven at 200° C. for 2 hours.

EXAMPLES 3 through 7

The samples in the Examples 3 through 7 and Reference 1 were prepared as described for the resin in Example 1. See Table 2.

In combination with phenol-formaldehyde epoxy resin A several anhydrides or mixtures thereof, viz. MZA, itaconic anhydride (ICA), and hexahydrophthalic anhydride (HHPA), were employed in the IPN with TAC prepolymer. A comparison of the Examples 3, 4, and 5 with Reference 1 shows that the thermal properties improve as the wholly saturated HHPA is replaced with MZA and ICA, on account of one network being chemically linked to the other.

Introduction of 3.2 wt. % of bromine by means of the partial replacement of epoxy resin A in Example 3 with epoxy resin E will give the resin from Example 1, which is shown by the flame test to be fire retardant. The resin of Example 6 also is fire retardant as a result of epoxy resin E being combined with epoxy resin B and so introducing a small amount of bromine (3.2 wt. %).

EXAMPLES 8 through 11

The TAC/MZA pre-copolymer, which was used in the Examples through 10 in a ratio of 2.28 parts by weight of TAC to 1 part by weight of MZA, was prepared as follows:

In a reactor fitted with a cooling apparatus and a stirrer there was added dropwise over a period of 2 hours at 82° C. to a 93%-solution of 360 g of TAC (1.45 moles) and 158 g of MZA (1.61 moles) in MEK 50.25 g of a 13.4%-solution of bis(ortho-methylbenzoyl peroxide) in MEK. Following a total reaction period of 8 hours the solution was cooled and freed of MEK by its being stripped off under reduced pressure. The viscosity was 220 mPa.s, the monomer conversion (mc) was 10%, the number average molecular weight (Mn)=1370, the dispersity 2.4 (determined using SEC-HPLC relative to polystyrene standards).

In Example 11 TAC/MZA prepolymer in a ratio of 2.82 parts by weight of TAC to 1 part by weight of MZA was prepared in analogous manner to the description given above, except that instead of bis(ortho-methylbenzoyl peroxide) there was employed benzoyl peroxide having an Mn=2053, D=1.5, mc=2%, and a viscosity of 450 mPa.s.

The composition and properties of the resin from Examples through 11 prepared analogous to Example 1 are compiled in Table 3.

EXAMPLES 12 through 15

The Examples 12 through 15 were worked out analogous to Example 1.

In Example 12 the TAC prepolymer was mixed with the 2,2-bis(4-methacryloxy-ethoxyphenyl)propane (BMEPP). In Example 15 the resin polymerizable under the influence of radicals employed was the (ortho-)diallyl phthalate prepolymer (DAP prepolymer) commercially available from Osaka. This resin contains less than 3% by weight of DAP monomer and has an iodine value of 60.

The composition of the formulated resins and the properties of the cured samples of Examples 12 through 15 are listed in Table 4.

TABLE 2

| | Resin composition and properties of the cured resin | | | | | |
|---|---|---|---|---|---|---|
| | Example 3 | Example 4 | Example 5 | Example 6 | Reference 1 | Example 7 |
| Allyl compound type/g | TACprep$^a$/50 | TACprep$^b$/50 | TACprep$^a$/50 | TACprep$^c$/50 | TACprep$^a$/50 | TACprep$^b$/50 |
| Epoxy resin type/g/equivalent | A/33/0.185 | A/30/0.169 | A/31/0.174 | B/27/0.154 E/6.45/0.014 | A/27/0.152 | A/27/0.152 |
| Anhydride type/g/equivalent | MAZ/17/0.173 | MZA/10/0.102 HHPA/10/0.065 | ICA/19/0.170 | MZA/16.55/0.169 | HHPA/23/0.149 | MZA/13/0.133 |
| Fraction by weight of allyl calculated on total solid | 0.50 | 0.50 | 0.50 | 0.50 | 0.50 | 0.60 |
| 10% of 2E4MI in MEK (g) | 0.50 | 0.50 | 1.0 | 1.5 | 0.50 | 0.80 |
| t-butylperoxy benzoate (g) | 0.50 | 0.50 | 0.50 | 0.50 | 0.50 | 0.60 |
| MEK (g) | 13 | 13 | 13 | 13 | 13 | 13 |
| DMF (G) | — | 2.5 | — | — | 1.0 | — |
| Tg by TMA (°C.) | 185 | 160 | 173 | 190 | 115 | 183 |
| TEC$_z$ (ppm/°C.) | | | | | | |
| < Tg | 47 | 101 | 40 | 50 | 100 | 58 |
| average (over 20°-250° C.) | 85 | 163 | 72 | 85 | 160 | 87 |
| TGA | | | | | | |
| loss at 300° C., % | 2 | 2 | 2 | 1 | 2 | 2 |
| decomp. max., °C. | 420 | 430 | 420 | 355 and 385 | 435 | 420 |
| residue at 650° C., % | 17 | 14 | 17 | 21 | 9 | 20 |

$^a$prepared with BPO, Mn = 5700; D = 8.2; mc = 41%
$^b$prepared with bis(ortho-methylbenzoyl)peroxide; Mn = 7420; D = 22; mc = 36%
$^c$prepared with BPO, Mn = 5175; D = 12.0; mc = 36%

TABLE 3

| | Resin composition and properties of the cure resin | | | |
|---|---|---|---|---|
| | Example 8 | Example 9 | Example 10 | Example 11 |
| Co-prepolymer TAC/MZA g/equiv. anhydride | 72/0.224 | 54/0.168 | 77.3/0.242 | 67.7/0.18 |
| TAC prepolymer, g | — | 7.0$^a$ | — | — |
| Epoxy resin type/g/equivalent | C/28/0.222 | C/28/0.222 | C/28.5/0.226 E/1.75/0.004 | A/30.3/0.17 E/2.00/0.004 |
| Fraction by weight of | 0.50 | 0.50 | 0.50 | 0.50 |

TABLE 3-continued

| Resin composition and properties of the cure resin | | | | |
|---|---|---|---|---|
| | Example 8 | Example 9 | Example 10 | Example 11 |
| allyl compound calculated on total solid | | | | |
| 10% of 2E4MI in MEK (g) | 1.0 | 1.0 | 0.25 | 0.5 |
| t-butylperoxy benzoate (g) | 1.0 | 1.0 | 0.5 | 0.5 |
| MEK (g) | 11 | 10 | 11 | 9 |
| Br % calculated on total solid | — | — | 0.8 | 1.0 |
| Tg (by TMA), °C. | 170 | 187 | 190 | 171 |
| $TEC_z$ (ppm/°C.) | | | | |
| < Tg | 78 | 53 | 45 | 49 |
| average (over 20°-250° C.) | 106 | 79 | 72 | 95 |
| TGA (under nitrogen) | | | | |
| loss at 300° C., % | 2 | 2 | 2 | 1 |
| decomp. max., °C. | 375 and 415 | 377 and 414 | 355 and 405 | 385 and 410 |
| residue at 650° C., % | 20 | 19 | 24 | 19 |
| Manual flame test, fire retardant? | no | no | yes | yes |

$^a$prepared with BPO. Mn = 9400; D = 20; mc = 38%

TABLE 4

| Resin composition and properties of the cured resin | | | | |
|---|---|---|---|---|
| | Example 12 | Example 13 | Example 14 | Example 15 |
| Allyl cpd., type/g | TACprep$^b$/50 | TACprep$^a$/25 | TACprep$^b$/30 | DAPprep/50 |
| BMEPP, g | — | 25 | 20 | — |
| MZA, g/equivalent | 9/0.092 | 9/0.092 | 18/0.184 | 18/0.184 |
| Epoxy resin type/g/equivalent | F/41/0.099 | F/41/0.099 | D/32/0.184 | D/32/0.184 |
| Fraction by weight of allyl & BMEPP calculated on total solid | 0.50 | 0.50 | 0.50 | 0.50 |
| 10% of 2E4MI in MEK (g) | 1.0 | — | — | 0.50 |
| 10% of 2MI in 2-methoxy-isopropanol, g | — | 1.0 | 0.5 | — |
| t-butylperoxy benzoate (g) | 0.5 | 0.5 | 0.5 | 0.5 |
| solvent, g | acetone, 10 | acetone, 10 | MEK, 11 | MEK, 33 |
| Br % calculated on total solid | 7.6 | 7.6 | 0 | 0 |
| Tg (by TMA). °C. | 175 | 130 | 180 | 190 |
| $TEC_z$ (ppm/°C.) | | | | |
| < Tg | 60 | 70 | 49 | 114 |
| average (over 20°-250° C.) | 90 | 140 | 92 | 135 |
| TGA (under nitrogen) | | | | |
| loss at 300° C., % | 2.0 | 1.8 | 1.6 | 2 |
| decomp. max., °C. | 345 and 380 | 362 | 412 | 397 |
| residue at 650° C., % | 19 | 12 | 13.0 | 3 |
| Manual flame test, fire retardant? | yes | yes | no | no |

$^a$prepared with BPO. Mn = 5700; D = 8.2; mc = 41%
$^b$prepared with bis(ortho-methylbenzoyl)peroxide. Mn = 6950; D = 15; mc = 31%

We claim:

1. An interpenetrating polymer network comprising a polymer built up from at least one polyallyl compound which is cross-linked under the influence of a radical initiator, an epoxy resin, and a cross-linking agent for the epoxy resin which is a cyclic carboxylic anhydride containing a radical-polymerizable functional group.

2. The polymeric material of claim 1, wherein the polyallyl compound is ring-containing.

3. The polymeric material of claim 2, wherein the ring-containing polyallyl compound is triallyl cyanurate or a prepolymer of triallyl cyanurate.

4. The polymeric material of claim 1 wherein the carboxylic anhydride is maleic anhydride.

5. The polymeric material of claim 1 wherein 40-60% by weight of the interpenetrating network is made up of epoxy resin.

6. The polymeric material of claim 1 wherein the epoxy resin is a phenol type epoxy resin.

7. The polymeric material of claim 1 wherein said polymer is built up from at least one polyallyl compound together with an aromatic difunctional methacrylate.

* * * * *